United States Patent
Chaney et al.

(10) Patent No.: US 8,003,957 B2
(45) Date of Patent: Aug. 23, 2011

(54) ETHANE IMPLANTATION WITH A DILUTION GAS

(75) Inventors: Craig R. Chaney, Rockport, MA (US); Adolph R. Dori, Gloucester, MA (US); Christopher R. Hatem, Salisbury, MA (US); Alexander S. Perel, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 284 days.

(21) Appl. No.: 12/367,741

(22) Filed: Feb. 9, 2009

(65) Prior Publication Data

US 2009/0200460 A1 Aug. 13, 2009

Related U.S. Application Data

(60) Provisional application No. 61/027,545, filed on Feb. 11, 2008.

(51) Int. Cl.
*G21K 5/10* (2006.01)
*H01J 37/08* (2006.01)

(52) U.S. Cl. ............... 250/492.21; 250/282; 250/423 F

(58) Field of Classification Search ............. 250/492.21; 438/515
See application file for complete search history.

(56) References Cited

U.S. PATENT DOCUMENTS

| | | | |
|---|---|---|---|
| 4,264,642 A | 4/1981 | Ferralli | |
| 4,283,249 A | 8/1981 | Ephrath | |
| 4,474,827 A | 10/1984 | Ferralli | |
| 5,346,600 A | 9/1994 | Nieh et al. | |
| 5,558,718 A | 9/1996 | Leung | |
| 5,693,376 A | 12/1997 | Fetherston et al. | |
| 5,985,742 A | 11/1999 | Henley et al. | |
| 6,090,456 A * | 7/2000 | Wu et al. | 427/577 |
| 6,183,843 B1 * | 2/2001 | Feng et al. | 428/212 |
| 6,399,489 B1 | 6/2002 | M'Saad et al. | |
| 6,713,390 B2 | 3/2004 | M'Saad et al. | |
| 6,716,713 B2 | 4/2004 | Todd | |
| 7,015,108 B2 | 3/2006 | Vanderpool et al. | |

(Continued)

FOREIGN PATENT DOCUMENTS

WO 2007027798 A2 3/2007
WO 2007087213 A2 8/2007

OTHER PUBLICATIONS

Koumei Baba et al., "Formation of Diamond Like Carbon Films by Plasma Source Ion Implantation from CH4, C2H2 and C6H6," 1998 Int'l Conf. on Ion Implantation Tech. Proceedings, 0-7803-4538, Dec. 1999, pp. 1214-1217, IEEE.

(Continued)

*Primary Examiner* — Robert Kim
*Assistant Examiner* — David Smith

(57) ABSTRACT

To implant a carbon-containing species, a gas containing carbon is ionized in the ion chamber. The ionization of this gas will typically produce a number of ionized species. However, many of these resulting ionized species are not beneficial to the desired implant, as they contain only non-carbon atoms. These species must be eliminated before the implantation, leaving only carbon-based species. However, the current of the desired species may be low, thereby requiring extra energy or time to implant the desired dosage of carbon into a substrate. This can be improved through the use of a second gas. This second gas is used to dilute the primary carbon-containing gas to be ionized in the ion chamber. By incorporating this dilution gas, more of the resulting ionized species are beneficial to the carbon implantation.

20 Claims, 3 Drawing Sheets

U.S. PATENT DOCUMENTS

| | | | |
|---|---|---|---|
| 7,137,354 | B2 | 11/2006 | Collins et al. |
| 2003/0038246 | A1 | 2/2003 | Reyes et al. |
| 2004/0164341 | A1 | 8/2004 | Forbes et al. |
| 2004/0235280 | A1 | 11/2004 | Keys et al. |
| 2005/0274128 | A1* | 12/2005 | Kishorenath et al. .......... 62/55.5 |
| 2007/0032004 | A1* | 2/2007 | Ramaswamy et al. ........ 438/197 |
| 2007/0148888 | A1 | 6/2007 | Krull et al. |

OTHER PUBLICATIONS

Zhaoxia Xie, "Nonlinear Effect of Carbon Cluster Induced Damage in Silicon," 16th Annual Conf. on the Application of Accelerators in Research & Industry, 0-7354-0015-6, 2001, pp. 987-990, American Inst. of Physics, Melville, NY, USA.

* cited by examiner

ETHANE IMPLANTATION WITH A DILUTION GAS

This application claims priority of U.S. Provisional Patent Application Ser. No. 61/027,545, filed Feb. 11, 2008, the disclosure of which is hereby incorporated by reference.

FIELD

This invention relates to the implantation of a carbon-containing species, and, more particularly, to the implantation of ethane with a dilution gas.

BACKGROUND

Ion implantation is a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

An ion implanter includes an ion source for converting a gas or a solid material into a well-defined ion beam. The ion beam typically is mass analyzed to eliminate undesired ion species, accelerated to a desired energy, and implanted into a target. The ion beam may be distributed over the target area by electrostatic or magnetic beam scanning, by target movement, or by a combination of beam scanning and target movement. The ion beam may be a spot beam or a ribbon beam having a long dimension and a short dimension.

Turning to FIG. 1, a block diagram of a beam-line ion implanter 200 that may provide ions for doping a selected material is illustrated. Those skilled in the art will recognize that the beam-line ion implanter 200 is only one of many examples of beam-line ion implanters that can provide ions for doping a selected material.

In general, the beam-line ion implanter 200 includes an ion source 280 to generate ions that form an ion beam 281. The ion source 280 may include an ion chamber 283 and a gas box containing a gas to be ionized. The gas is supplied to the ion chamber 283 where it is ionized. Ions are created by applying a voltage across the electrodes of the chamber, known as an arc voltage. Additionally, a magnetic field is provided to control the motion of the ionized particles. This is achieved by passing a current through a source magnet. This gas may be or may include, in some embodiments, arsenic, boron, phosphorus, carborane $C_2B_{10}H_{12}$, or another large molecular compound. In other embodiments, the gas may be an alkane, such as ethane, or another atomic or molecular carbon-containing species. The ions thus formed are extracted from the ion chamber 283 to form the ion beam 281. The ion beam 281 is directed between the poles of resolving magnet 282. A power supply is connected to an extraction electrode of the ion source 280 and provides an adjustable voltage, for example, between about 0.2 and 80 kV in a high current ion implanter. Thus, singly charged ions from the ion source are accelerated to energies of about 0.2 to 80 keV by this adjustable voltage.

The ion beam 281 passes through a suppression electrode 284 and ground electrode 285 to mass analyzer 286. Mass analyzer 286 includes resolving magnet 282 and masking electrode 288 having resolving aperture 289. Resolving magnet 282 deflects ions in the ion beam 281 such that ions of a desired ion species pass through the resolving aperture 289. Undesired ion species do not pass through the resolving aperture 289, but are blocked by the masking electrode 288. In one embodiment, resolving magnet 282 deflects ions of the desired species by about 90°.

Ions of the desired ion species pass through the resolving aperture 289 to the angle corrector magnet 294. Angle corrector magnet 294 deflects ions of the desired ion species and converts the ion beam from a diverging ion beam to ribbon ion beam 212, which has substantially parallel ion trajectories. In one embodiment, the angle corrector magnet 294 deflects ions of the desired ion species by about 70°. The beam-line ion implanter 200 may further include acceleration or deceleration units in some embodiments.

An end station 211 supports one or more workpieces, such as workpiece 138, in the path of ribbon ion beam 212 such that ions of the desired species are implanted into workpiece 138. The end station 211 may include a platen 295 to support the workpiece 138. The end station 211 also may include a scanner (not shown) for moving the workpiece 138 perpendicular to the long dimension of the ribbon ion beam 212 cross-section, thereby distributing ions over the entire surface of workpiece 138. Although the ribbon ion beam 212 is illustrated, other embodiments may provide a spot beam.

The ion implanter may include additional components known to those skilled in the art. For example, the end station 211 typically includes automated workpiece handling equipment for introducing workpieces into the beam-line ion implanter 200 and for removing workpieces after ion implantation. The end station 211 also may include a dose measuring system, an electron flood gun, or other known components. It will be understood to those skilled in the art that the entire path traversed by the ion beam is evacuated during ion implantation. The beam-line ion implanter 200 may incorporate hot or cold implantation of ions in some embodiments.

Ion implantation is an effective method to introduce dopants into a substrate, however there are unwanted side effects that must be addressed. For example, implanted ions often distribute themselves at deeper depths than expected. It is believed that this is caused by a phenomenon known as channeling, where ions are moved or channeled along axes and planes of symmetry in the crystalline structure. Thus, the ions may be implanted substantially between atoms in the crystal lattice in the substrate. This channeling effect causes a deeper concentration of the dopant, which increases the effective junction depth.

Traditionally, to overcome this problem, the workpiece or substrate is implanted with heavier species before the actual dopant implantation. This implantation is known as the pre-amorphization implantation, or PAI. Typically, a heavier species, such as silicon or germanium is implanted into the substrate to effectively change the silicon crystalline structure into an amorphous layer. Because the amorphous layer lacks an organized crystal structure, the implanted ions may not channel between atoms in the crystal lattice. This amorphous layer significantly reduces channeling, thereby alleviating the issue described above.

However, the PAI step is not without its drawbacks. These species tend to cause residual damage at end of range (referred to as EOR defects). For example, germanium creates a large amount of damage, in terms of dislocation. Furthermore, germanium does not recrystallize well during the annealing process. These EOR defects introduce leakage into the resulting CMOS transistors. As junction depths get smaller and smaller, this leakage becomes more problematic.

In certain embodiments, carbon can be used as a co-implant species in association with another PAI, typically germanium. The purpose of the carbon implant is to position the carbon between the shallow dopant and the EOR damage caused by the PAI implant. These implanted carbon atoms, also known as substitutional carbon, may block some of the interstitials coming back from EOR during the anneal that would otherwise cause transient enhanced diffusion (TED) and boron interstitial cluster (BIC) formation. However, the range of carbon often overlaps with that of the PAI species, and so the carbon implant itself contributes to PAI. Thus, carbon may also be used as a PAI species in its own right.

Carbon can also be used to create localized compressive strain. Therefore, if one creates a source/drain out of SiC, carbon implantation will cause tensile strain in the channel. This may improve NMOS behavior. Incorporating carbon into the crystal lattice may require the use of epitaxial growth or the implantation a high dose of carbon into the silicon lattice. This may cause amorphization, and in regrowth the carbon is incorporated into the lattice.

Amorphization and stress are both important to semiconductor manufacturers. Accordingly, there is a need in the art for a new and improved method of implanting a carbon-containing species, and more particularly, a new and improved method of implanting ethane.

SUMMARY

The problems of the prior art are overcome by the method described in this disclosure. To implant a carbon-containing species, a gas containing carbon is ionized in the ion chamber. The ionization of this gas will typically produce a number of ionized species. However, many of these resulting ionized species are not beneficial to the desired implant, as they contain only non-carbon atoms. These species must be eliminated before the implantation, leaving only carbon-based species. However, the current of the desired species may be low, thereby requiring extra energy or time to implant the desired dosage of carbon into the substrate. This can be improved through the use of a second gas. This second gas is used to dilute the primary carbon-containing gas to be ionized in the ion chamber. By incorporating this dilution gas, more of the resulting ionized species are beneficial to the carbon implantation. In other words, the current distribution of the resulting ionized species can be advantageously altered through the use of a second gas.

BRIEF DESCRIPTION OF THE DRAWINGS

For a better understanding of the present disclosure, reference is made to the accompanying drawings, which are incorporated herein by reference and in which.

DETAILED DESCRIPTION

As described above, to implant carbon into the substrate, typically a carbon-containing gas is ionized in the ion chamber 183 of the ion implantation system 200. This gas can be one of many types, including but not limited to decaborane alkanes of the chemical composition $C_nH_{2n+2}$, such as ethane, and other suitable gasses.

Figure 1:
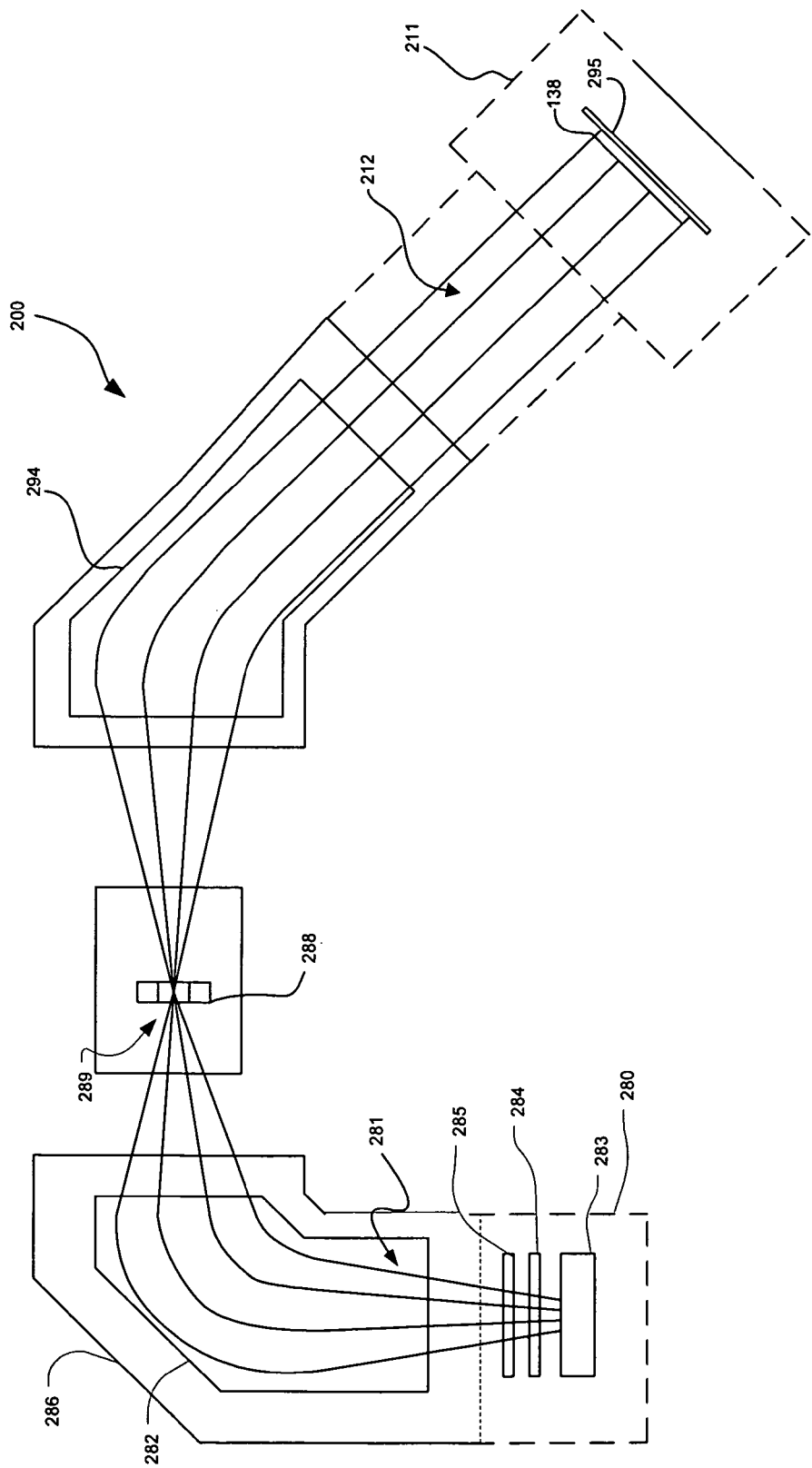
FIG. 1 is a block diagram of a beam-line ion implanter for doping a material with ions.
Figure 2:
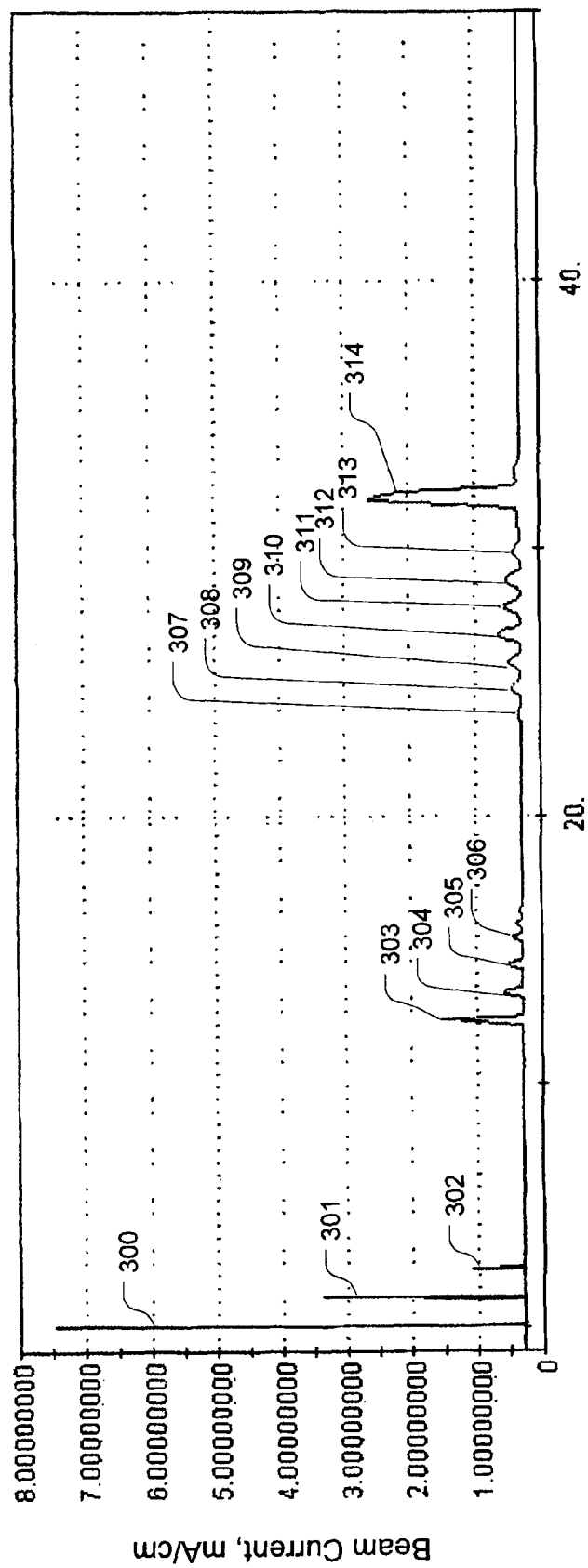
FIG. 2 is a chart illustrating beam spectrum with only ethane as a process gas.

When these gasses are ionized, they generate a number of ionized species, each containing a subset of the atoms in the carbon-containing gas. FIG. 2 is a chart illustrating beam spectrum using ethane as a process gas. In this particular example, ethane ($C_2H_6$) was implanted without a dilution gas. FIG. 2 shows a number of peaks, each associated with an ionized species. The magnitude of each current is shown on the vertical axis, while the atomic mass (in AMU) is displayed on the horizontal axis. This was generated using a gas flow of 20 sccm, an arc voltage of 90V and a source magnet current of 4.0 Amps.

Peaks 300, 301, 302 correspond to $H^+$, $H_2^+$ and $H_3^+$, respectively. Peak 303 corresponds to $C^+$, while peaks 304, 305 and 306 correspond to $CH^+$, $CH_2^+$ and $CH_3^+$, respectively. Peak 307 corresponds to $C_2+$, while peaks 308-312 correspond to $C_2H^+$, $C_2H_2^+$, $C_2H_3^+$, $C_2H_4^+$, and $C_2H_5^+$ respectively. Peak 313 corresponds to ionized ethane. Note that this chart represents an instantaneous snapshot of the current outputs. A detailed study of the emitted ionized species showed an actual current of approximately 9.5 mA of $H_1^+$, approximately 4.0 mA of $H_2^+$, approximately 1.8 mA of $H_3^+$, and approximately 1.8 mA of C-12. The ethane ($C_2H_6$) peak 313 had a maximum current of approximately 0.9 mA. Peak 314 corresponds to residual $P^+$, which is used to clean the beam-line ion implanter.

During carbon implantation, preferably only ionized carbon is passed through the mass analyzer 286 and resolving aperture 289. Thus, only peaks 303 through 313 are used to implant to substrate. Note that these peaks represent a very small portion of the total current produced by ionizing ethane. In other embodiments, only pure carbon (i.e. peak 303) is passed through the mass analyzer for implantation into the substrate.

Since these currents are so small, long implant times may be required to achieve the desired concentration of carbon in the substrate. This requires long implantation times, thereby reducing the efficiency and utilization of the ion implantation system 200. Thus, an increase in the current of carbon-containing species would improve the efficiency of the ion implantation system 200. An increased utilization of the tool may also be realized.

The use of dilution gases is known in the art, especially for use with plasma immersion systems. In many cases, the dilution gas is selected due to its specific properties and its effect on the substrate. For example, dilution gases are used to aid in the removal of the deposited surface layers. Fluorine is often used as a dilution gas due to its ability to chemically sputter the surface layer.

However, unexpectedly, it has been found that the inclusion of a suitable dilution gas may be used to modify the current distribution of the ionized species formed from the process gas in the ion chamber. In other words, the use of a dilution gas with a process gas such as ethane or other hydrocarbons causes the process gas to ionize differently. Thus, rather than using the dilution gas because of its effect on the substrate, the dilution gas is included due to its effect on the ionization of the process gas.

Figure 3:
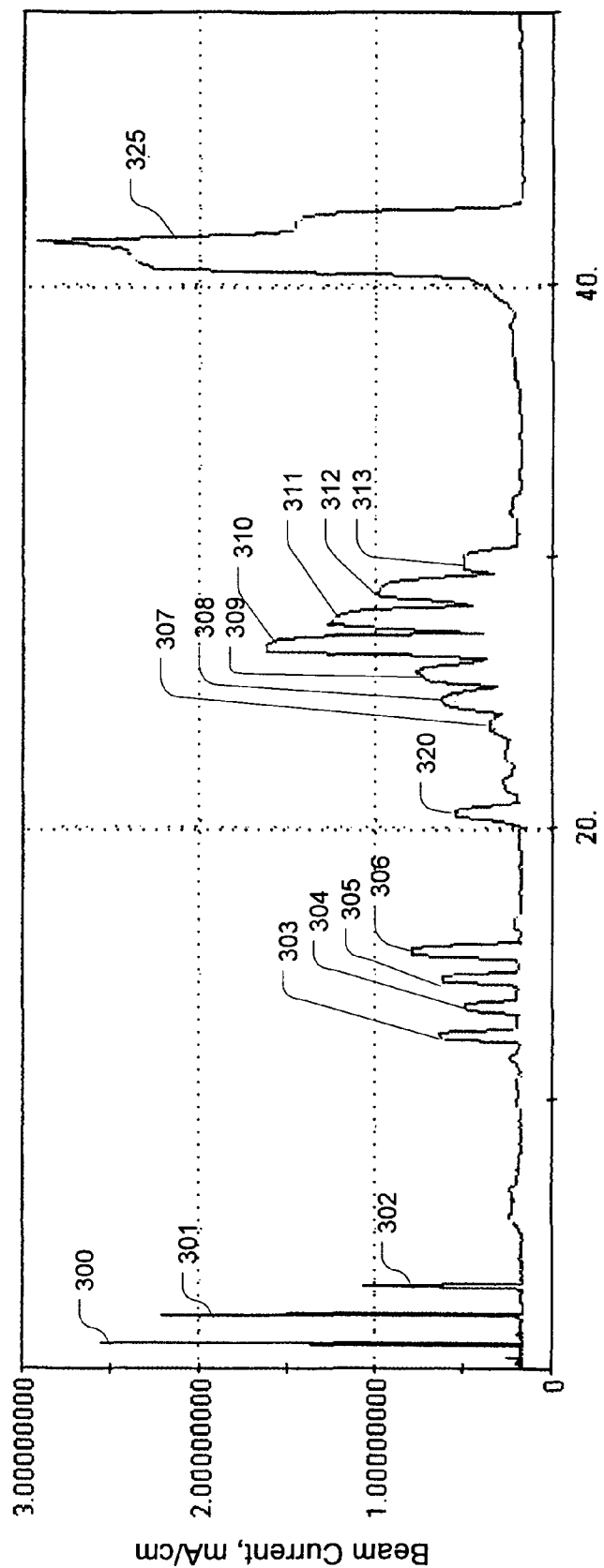
FIG. 3 is a chart illustrating beam spectrum with ethane and argon as process gases.

FIG. 3 is a chart illustrating beam spectrum with ethane and argon as process gases. In this example, argon was introduced as a dilution gas with the ethane. Peaks with the same molecular composition are similarly numbered in FIG. 3. Thus, peaks 300, 301 and 302 correspond to $H^+$, $H_2^+$, and $H_3^+$, respectively, as was the case in FIG. 2. This test was performed using a gas flow of 23.7 sccm of ethane and 1.5 sccm of Argon. Additionally, the arc voltage was 80V and the source magnet was 0.8 A.

Detailed analysis of these species showed that the ethane implant beam spectrum included approximately 2.5 mA of $H^+$, approximately 2.2 mA of $H_2^+$, approximately 1.1 mA of $H_3^+$, and approximately 1.7 mA of $C-12^+$. The beam spectrum also included various peaks of argon gas, including approximately 3.0 mA of $Ar^+$ 325 and a small peak of $Ar^{++}$ 320. Note that the maximum ethane peak 313 was approximately 1.5 mA. In addition, peaks 307-313 were increased.

Thus, by introducing argon as a dilution gas with the ethane, the current distribution of the various ionized species was modified. The ethane beam current was increased. Furthermore, beam currents associated with all carbon-containing species, especially those with an AMU greater than 20, were increased. In other words, beam currents for all $C_2H_x$ species (where x is between 0 and 6) were increased. Simultaneously, the hydrogen beam currents were reduced. Thus, rather than creating hydrogen-based currents totaling over 15 mA, the introduction of argon reduced the hydrogen current to a total of 5.8 mA. As an additional benefit, it was found that lower arc voltage and source magnet power may also be required to optimize the ion beam when using argon as a dilution gas. Therefore, the ion implantation system 200 is more efficiently utilized, as greater currents of carbon-based ion species are created, while hydrogen currents are reduced. Additionally, these increased currents are created using lower arc voltage and source magnet currents than previously implemented.

This process may be used with other carbon-containing species besides ethane. Dilution gases may also be applied to ion beams containing other alkanes, such as methane, propane, or butane, but also to larger carbon-containing molecules such as, for example, carborane $C_2B_{10}H_{12}$ or decaborane. Thus, this process is not limited solely to ethane and can be applied to any carbon-containing species known to those skilled in the art. Furthermore, this process is not solely limited to argon. Other noble gases, such as, but not limited to, xenon or helium, may also be used as dilution gases. Hydrogen may also be used as a dilution gas.

The operation of the pumps in the beam-line ion implanter may also be configured to increase the ethane beam current and reduce the hydrogen beam currents. For example, turbopumps may be controlled to reduce the hydrogen content in the implanter and the hydrogen that appears in the beam spectrum. Manipulation of the beam currents through use of the turbopumps can be performed in conjunction with the argon dilution gas. Alternatively, the pumps can be controlled without use of an argon dilution gas.

The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A method of increasing the production of carbon-containing ionized species, comprising:
   supplying a process gas comprising carbon into an ion chamber;
   supplying a dilution gas into said ion chamber;
   ionizing said process gas and said dilution gas, whereby said process gas creates higher currents of carbon-containing ionized species in said ion chamber due to the presence of said dilution gas than are created without said dilution gas;
   mass analyzing said carbon-containing ionized species; and
   implanting said carbon-containing ionized species into a substrate.

2. The method of claim 1, wherein said process gas comprises a hydrocarbon.

3. The method of claim 1, wherein said process gas comprises an alkane.

4. The method of claim 3, wherein said process gas comprises ethane.

5. The method of claim 1, wherein said dilution gas comprises a noble gas.

6. The method of claim 5, wherein said noble gas comprises argon.

7. A method of increasing the current of carbon-containing ionized species being implanted into a substrate, comprising:
   utilizing an ion implantation system comprising an ion chamber adapted to ionize a process gas into an ion beam, and a mass analyzer adapted to pass through only selected species of said ion beam;
   injecting said process gas into said ion chamber;
   injecting a dilution gas into said ion chamber;
   ionizing said process gas and said dilution gas, whereby said process gas creates higher currents of carbon-containing ionized species upstream of said mass analyzer due to the presence of said dilution gas than are created without said dilution gas; and
   using said mass analyzer to remove species that do not contain carbon.

8. The method of claim 7, further comprising using said mass analyzer to remove species comprising said dilution gas.

9. The method of claim 7, wherein said process gas comprises a hydrocarbon.

10. The method of claim 7, wherein said process gas comprises an alkane.

11. The method of claim 10, wherein said process gas comprises ethane.

12. The method of claim 7, wherein said dilution gas comprises a noble gas.

13. The method of claim 12, wherein said noble gas comprises argon.

14. The method of claim 7, further comprising using said mass analyzer to remove species that do not consist only of carbon.

15. A method of implanting carbon-containing ionized species into a substrate, comprising:
   utilizing an ion implantation system comprising an ion chamber adapted to ionize ethane into an ion beam, and a mass analyzer adapted to pass through only selected species of said ion beam;
   supplying said ethane into said ion chamber;
   supplying argon into said ion chamber;
   ionizing said ethane and said argon, whereby said ethane creates higher currents of carbon-containing ionized species in said ion chamber due to the presence of said argon than are created without said argon;
   using said mass analyzer to remove unwanted species from an ion beam;
   reducing hydrogen in said ion beam using a pump; and
   implanting desired species into said substrate.

16. The method of claim 15, wherein said mass analyzer is used to remove species that do not contain carbon.

17. The method of claim 15, wherein said mass analyzer is used to remove species comprising said argon.

18. The method of claim 15, wherein said mass analyzer is used to remove species that do not consist only of carbon.

19. The method of claim 5, wherein said noble gas comprises helium or neon.

20. The method of claim 12, wherein said noble gas comprises helium or neon.

* * * * *